United States Patent [19]

Kye et al.

[11] Patent Number: 5,726,741
[45] Date of Patent: Mar. 10, 1998

[54] PHOTOLITHOGRAPHIC PROJECTION SYSTEMS INCLUDING GRATING MASKS AND RELATED METHODS

[75] Inventors: Jong-wook Kye, Seoul; Cheol-hong Kim, Kyungki-do; Tae-gyun Kim, Seoul, all of Rep. of Korea

[73] Assignee: Samsung Electronics Co., Ltd., Suwon, Rep. of Korea

[21] Appl. No.: 668,904

[22] Filed: Jun. 24, 1996

[30] Foreign Application Priority Data

Jun. 30, 1995 [KR] Rep. of Korea ............. 95-19039

[51] Int. Cl.[6] .................. G02B 27/44; G03B 27/42
[52] U.S. Cl. ............... 355/67; 355/53; 359/227; 359/232
[58] Field of Search ............ 355/53, 54; 359/227, 359/232; 378/147, 150, 151

[56] References Cited

U.S. PATENT DOCUMENTS

| | | | |
|---|---|---|---|
| 5,348,837 | 9/1994 | Fukuda et al. | 355/53 |
| 5,357,311 | 10/1994 | Shiraishi | 355/53 |
| 5,446,587 | 8/1995 | Kang et al. | 355/53 |
| 5,473,410 | 12/1995 | Nishi | 355/53 |
| 5,552,856 | 9/1996 | Shiraishi et al. | 355/53 |

*Primary Examiner*—R. L. Moses
*Assistant Examiner*—Shival P. Virmani
*Attorney, Agent, or Firm*—Myers, Bigel, Sibley & Sajovec, L.L.P.

[57] ABSTRACT

A photolithographic projection system for transferring a predetermined pattern from a photomask to a wafer includes a radiation source and a grating mask. The radiation source projects radiation along a path through the photomask toward the wafer. The grating mask is positioned along the radiation path and is separate from the photomask. In a method for transferring a predetermined pattern from a photomask to a wafer, radiation is projected along a path through a grating mask and a photomask toward the wafer, and the grating mask is separate from the photomask.

12 Claims, 11 Drawing Sheets

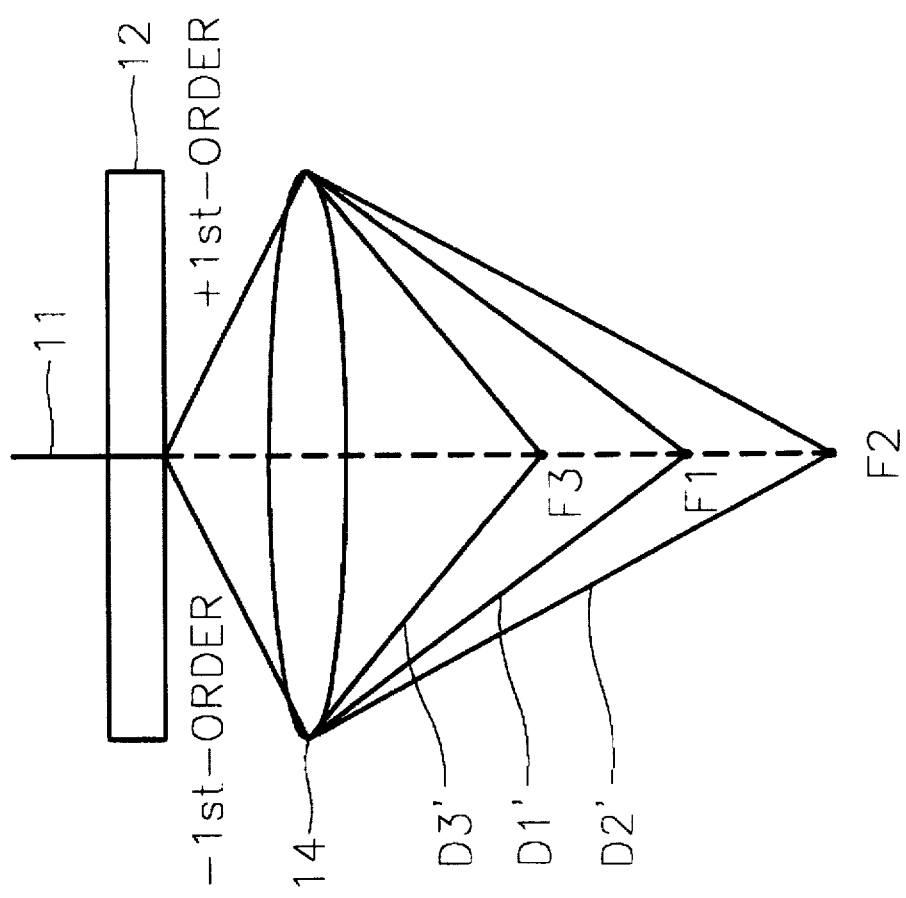

PHOTOLITHOGRAPHIC PROJECTION SYSTEMS INCLUDING GRATING MASKS AND RELATED METHODS

FIELD OF THE INVENTION

The present invention relates to the field of microelectronics processing, and more particularly to photolithographic processing.

BACKGROUND OF THE INVENTION

According to a conventional photolithographic projection technique, a photosensitive layer is formed on a layer which is to be patterned. For example, the photoresist layer can be formed on an insulating layer, a metal layer, or any other layer to be patterned. This photosensitive layer has a solubility which is changed by exposure to radiation such as visible light, ultraviolet light, an electron beam, or x-rays.

The photosensitive layer is selectively exposed to light and developed to leave a portion of the photoresist layer having a predetermined pattern. Accordingly, portions of the layer below the patterned photoresist layer are now selectively exposed and can be etched using the patterned photoresist layer as a mask. After etching, the predetermined pattern is thus transferred from the patterned photoresist layer to the layer beneath.

For the fabrication of highly integrated circuits such as a 256M dynamic random access memory (DRAM), kryptonfluoride (KrF) eximer laser photolithography using off-axis illumination (OAI) methods may be used. Further improvements may be obtained by using Advanced Tilted Illumination on Mask (ATOM) methods. According to an ATOM method, light is projected at a different angle by modifying the aperture of the light exposure system, or light is diffractively illuminated using a grating mask, so that the depth of focus (DOF) and resolution can be increased. The depth of field is a range up and down from the center of the focus of light transmitted from the mask over which patterns can be transferred.

FIG. 1A illustrates the depth of field of a diffraction limited system with interference between zeroth-order, +1st-order, -1st-order diffracted light. The light 11 is generated by a light source and diffracted while passing through the photomask 12. The diffracted light is again focused by lens 14. Here, the zeroth-order diffracted light travels vertically with respect to the lens 14 while the -1st-order and the +1st-order diffracted light travel at predetermined angles with respect to the zeroth-order diffracted light.

When the vertically incident zeroth-order diffracted light and the obliquely incident -1st-order and +1st-order diffracted light are focused by the lens 14, the printable focal position can be varied from F1 to F2 depending on the maximum diffraction angle of the -1st-order and +1st-order diffracted light. Accordingly, the zeroth-order diffracted light has a path difference from D1 to D2, and the -1st-order and +1st-order diffracted light have a path difference from D1' to D2'. The light transcribed thus interferes either destructively or constructively as a function of the path differences.

When the light interferes destructively, no pattern is transcribed on the wafer. Accordingly, the focal position should be located at a range that the light does not interfere destructively so that patterns can be transcribed onto the wafer.

When the focal position is varied from F1 to F3, path link differences of the zeroth-order diffracted light and the ±1st-order diffracted light change from D1 to D3 and from D1' to D3', respectively. This change is the same as that which results when the focal position is changed from F1 to F2. If the focal position is located in the range from F2 to F3 (called the depth of focus), patterns can be transcribed onto the wafer. The patterns can also be transcribed onto the wafer when the focal position is located outside of the depth of focus. In this case, however, the aberration is a more dominant factor than the diffraction. If the pattern size is larger than the aberration, the pattern can be printed. If the pattern size is on the order of that of the diffraction region, however, it cannot be printed.

FIG. 1B illustrates the interference of the light for each of the illustrated focal positions F1, F2 and F3. As shown, the light intensity varies depending on the interference between the zeroth-order diffracted light and the -1st-order and +1st-order diffracted light when the focal positions are located at F1, F2, and F3. When there is no phase difference between the zeroth-order diffracted light and the -1st-order and +1st-order diffracted light, the light intensity is amplified by the constructive interference. In contrast, when the phase of the zeroth-order diffracted light is opposite that of the -1st-order and +1st-order diffracted light, the light intensity is zero as a result of the destructive interference.

FIG. 2A illustrates the depth of focus when the zeroth-order diffracted light is not focused. In particular, light 11 from the light source is diffracted by the photomask 12. Of the diffracted light, only the -1st-order and +1st-order diffracted light is focused by the lens 14 and the zeroth-order diffracted light is not focused. In this case, the -1st-order and +1st-order diffracted light have the same path length and, as a result, the same phase. Accordingly, the -1st-order and +1st-order diffracted light reach the focal point with the same phase irrespective of the position of the focal point. The depth of focus thus becomes infinite because the destructive interference (which requires differing path lengths) does not occur.

FIG. 2B illustrates the interference of light as a function of the focal positions F1, F2 and F3 of FIG. 2A. As shown, the light intensity is amplified as a result of the constructive interference because the -1st-order diffracted light and the +1st-order diffracted light are always in the same phase.

FIG. 3 illustrates a conventional off-axis illumination system including a light source 20, an aperture 22, a condenser lens 24, a photomask 26, an objective lens 28, and a wafer 30 on which a predetermined pattern is to be transcribed from the photomask. In the off-axis illumination system, the depth of focus is deepened by improving the structure of the aperture.

The light from the light source 20 passes through the aperture 22, the condenser lens 24, and the photomask 26. This light is focused by the objective lens 28 and then illuminated on the wafer 30. One component of the incident -1st-order and +1st-order diffracted light strays from the objective lens 28. Thus, only the remainder component of the -1st-order and +1st-order diffracted light and the zeroth-order diffracted light are illuminated on the wafer 30.

If the diameter of the light-transmitting range on the aperture used in the projection exposure system is 1, the aperture used in the conventional off-axis illumination system may intercept the light over an area corresponding to a diameter of 0.8. In this case, the light-transmitting range has a light intensity of 34% when compared to the aperture used in a general illumination system.

The aperture used in the off-axis illumination system has a center region which is covered to remove the vertically incident component of a light, thereby reducing the amount of the focused light. Accordingly, the exposure time and the light intensity should be increased to prevent deterioration of the pattern transcribed on the wafer.

FIG. 4 illustrates a system for implementing the ATOM projection method discussed above to improve the conventional off-axis illumination method. In this figure, a grating mask 32 diffracts the vertically incident component of the light at a predetermined angle. In particular, light from the light source 20 passes through the aperture 22 and is then incident on condenser lens 24 and photomask 26 on which the grating mask 32 is mounted. The light transmitted from the photomask 26 is focused by the objective lens 28 and then illuminated onto the wafer 30.

According to the ATOM method, the central region of the aperture is not covered, and the amount of light focused by the objective lens 28 is equal to that of the general illumination method. The grating mask, however, is adapted to diffract the vertically incident component of the light at a predetermined angle thereby achieving the same result as that of the off-axis illumination method.

Particular grating masks for diffracting the vertically incident component of light are shown in FIGS. 5A and 5B. FIG. 5A illustrates a dipole grating mask on which raised portions and depressions are formed in a layer of a material which can be the same as the material used for the substrate of the mask. The raised portions and depressions can be formed by selectively removing portions of the grating substrate. The dipole grating mask is a non-light-interception-layer mask.

FIG. 5B illustrates a quardrupole grating mask on which raised portions and depressions are provided in a quadrilateral lattice shape. The raised portions and depressions can be formed using the same material as used to form the substrate. The quardrupole grating mask is also a non-light-interception-layer mask.

According to the ATOM method, a grating pattern is formed on the rear surface of the photomask, or a manufactured grating mask is attached to the photomask. Accordingly, a separate grating mask is required for each photomask thereby increasing the cost of photomask production. In addition, it may difficult to inspect the photomask once the grating mask has been attached thereto or formed thereon.

SUMMARY OF THE INVENTION

It is therefore an object of the present invention to provide improved photolithographic projection systems and methods.

This and other objects are provided according to the present invention by a photolithographic projection system including a radiation source and a grating mask. The radiation source projects radiation along a path through a photomask toward a wafer. The grating mask is positioned along the radiation path and is separate from the photomask. Accordingly, a single grating mask can be used to provide off-axis illumination regardless of the number of photomasks which can be used in the system.

The grating mask can be spaced apart from the photomask, and it can be positioned between the radiation source and the photomask. In addition, the grating mask can be located between blinds which are located adjacent the radiation path, or the system can include a fly's eye lens positioned along the radiation path between the grating mask and the photomask.

According to another aspect of the present invention, a method for transferring a predetermined pattern from a photomask to a wafer can include the step of projecting radiation along a path through a grating mask and the photomask toward the wafer. In this method, the grating mask is separate from the photomask.

According to the present invention, off-axis illumination can be provided by a photolithographic projection system using only one grating mask and any number of photomasks. Accordingly, it is not necessary to manufacture a large number of photomasks, and each photomask and the grating mask can be inspected separately.

BRIEF DESCRIPTION OF THE DRAWINGS

FIG. 2A is a schematic view illustrating the depth of focus when the zeroth-order diffracted light is not focused according to the prior art.

DETAILED DESCRIPTION

Figure 1A:
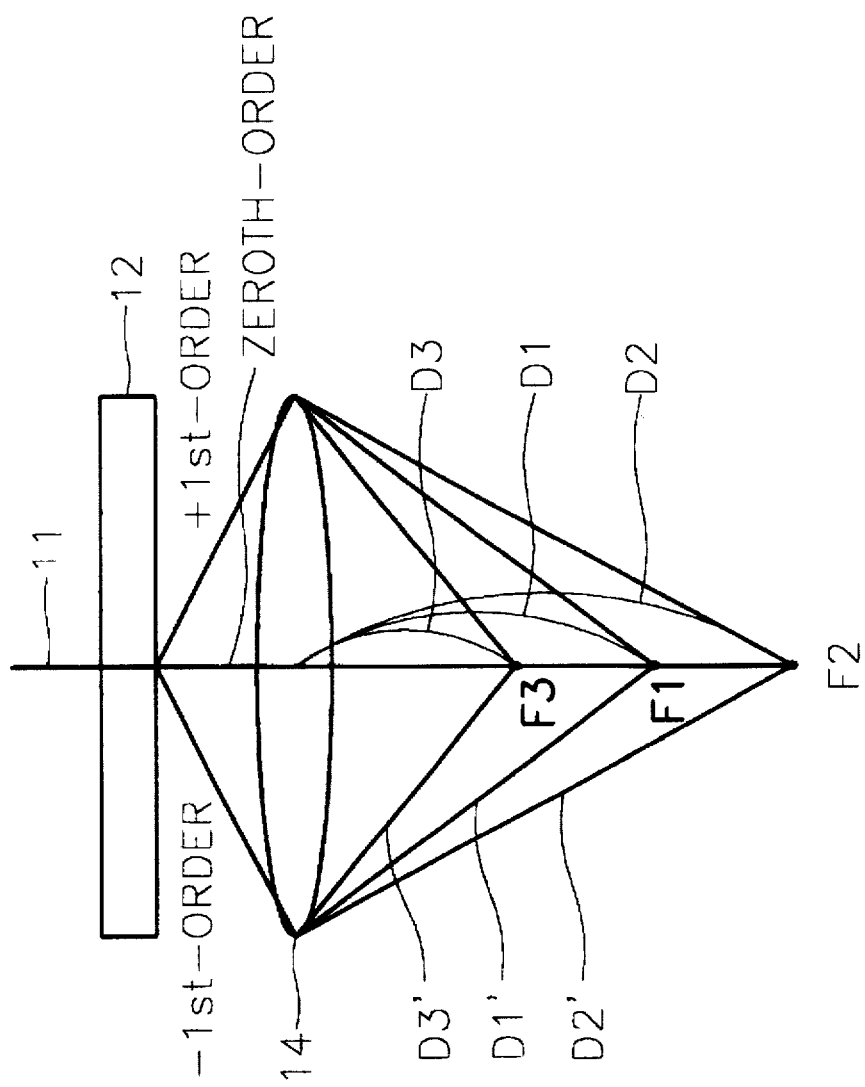
FIG. 1A is a schematic view illustrating the depth of focus when the zeroth-order diffracted light and the −1st-order and +1st-order diffracted light are focused according to the prior art.
Figure 1B:
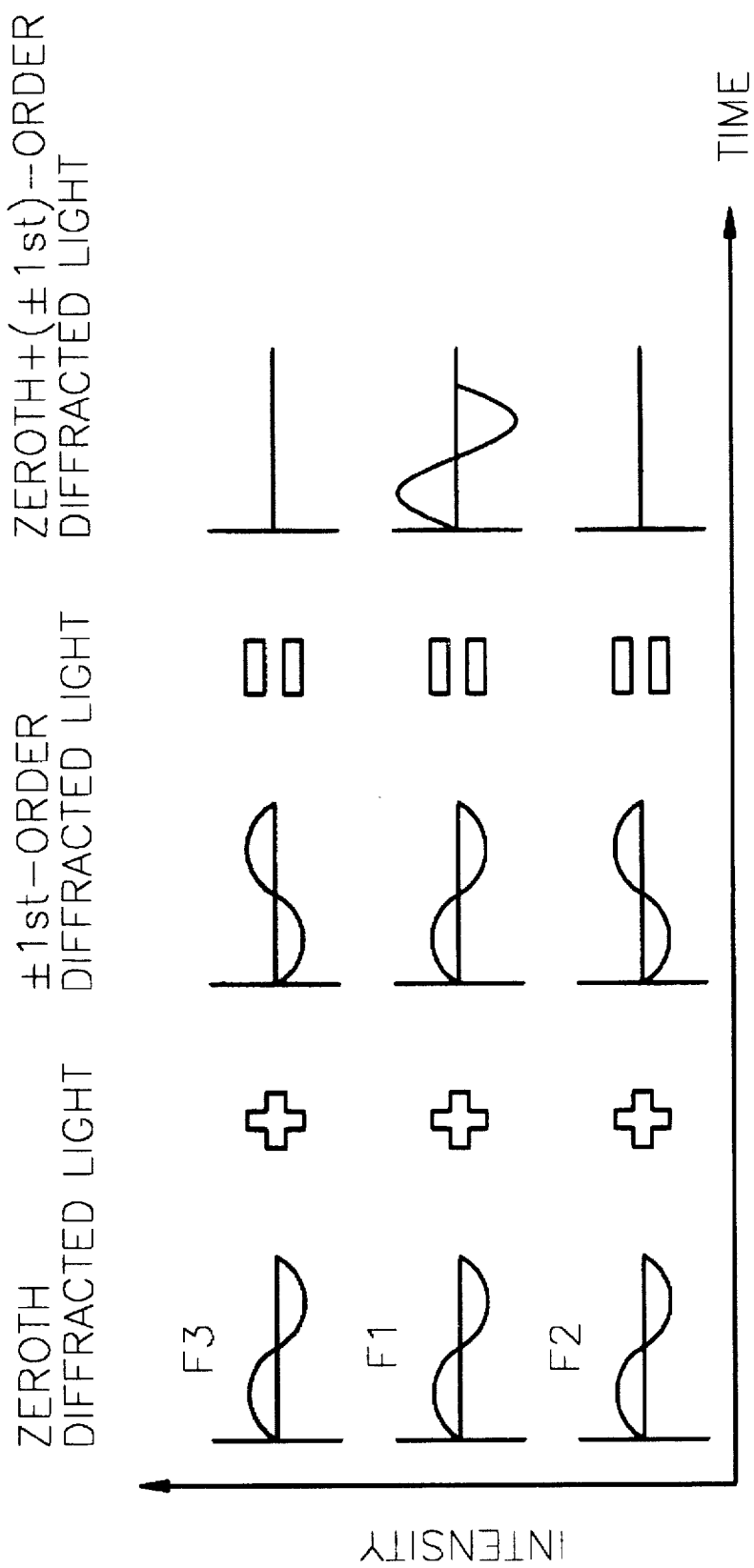
FIG. 1B is a graphical view illustrating the interference of the light as a function of the focal positions of FIG. 1A.
Figure 2B:
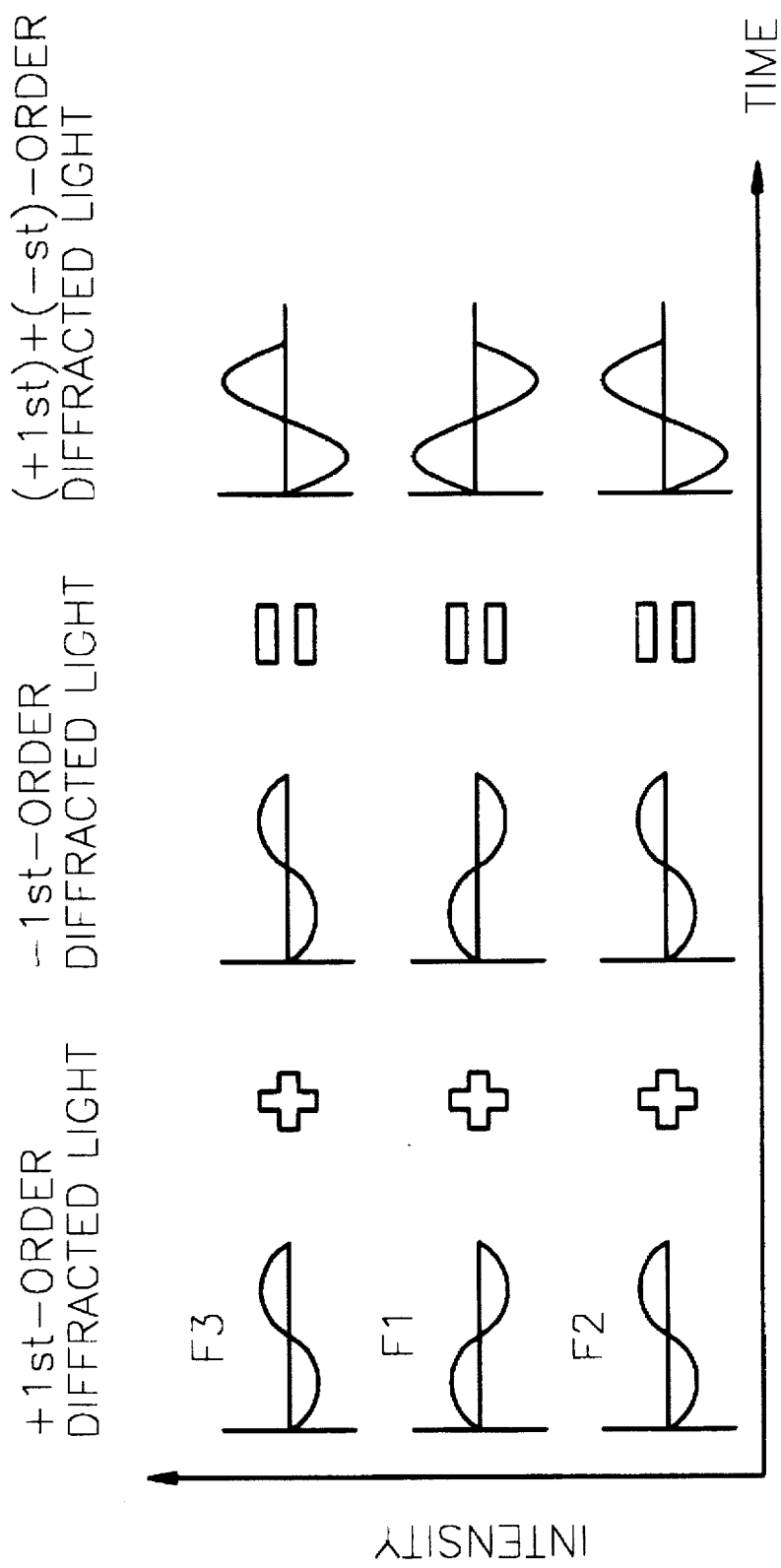
FIG. 2B is a graphical view illustrating the interference of the light as a function of the focal positions of FIG. 2A.
Figure 3:
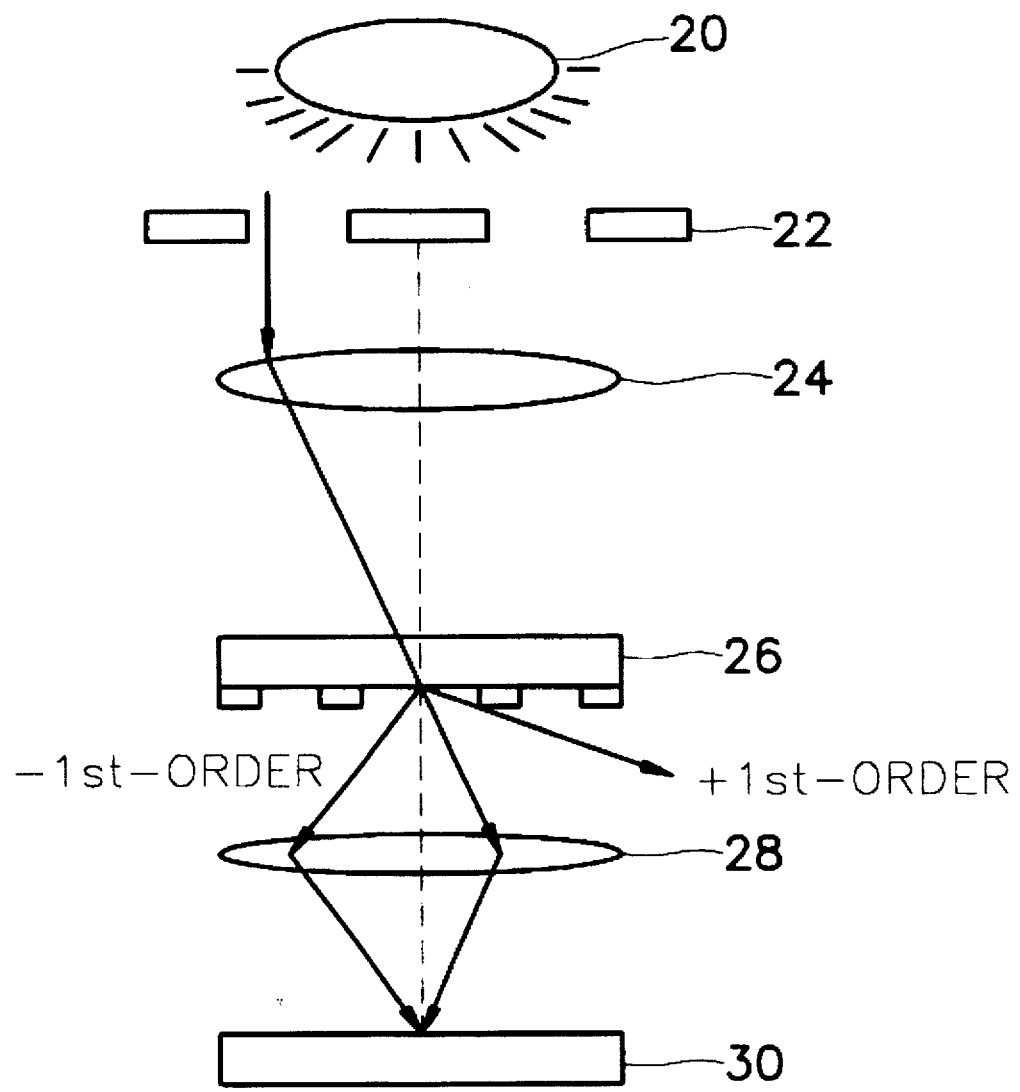
FIG. 3 is a schematic view illustrating an off-axis illumination system according to the prior art.
Figure 4:
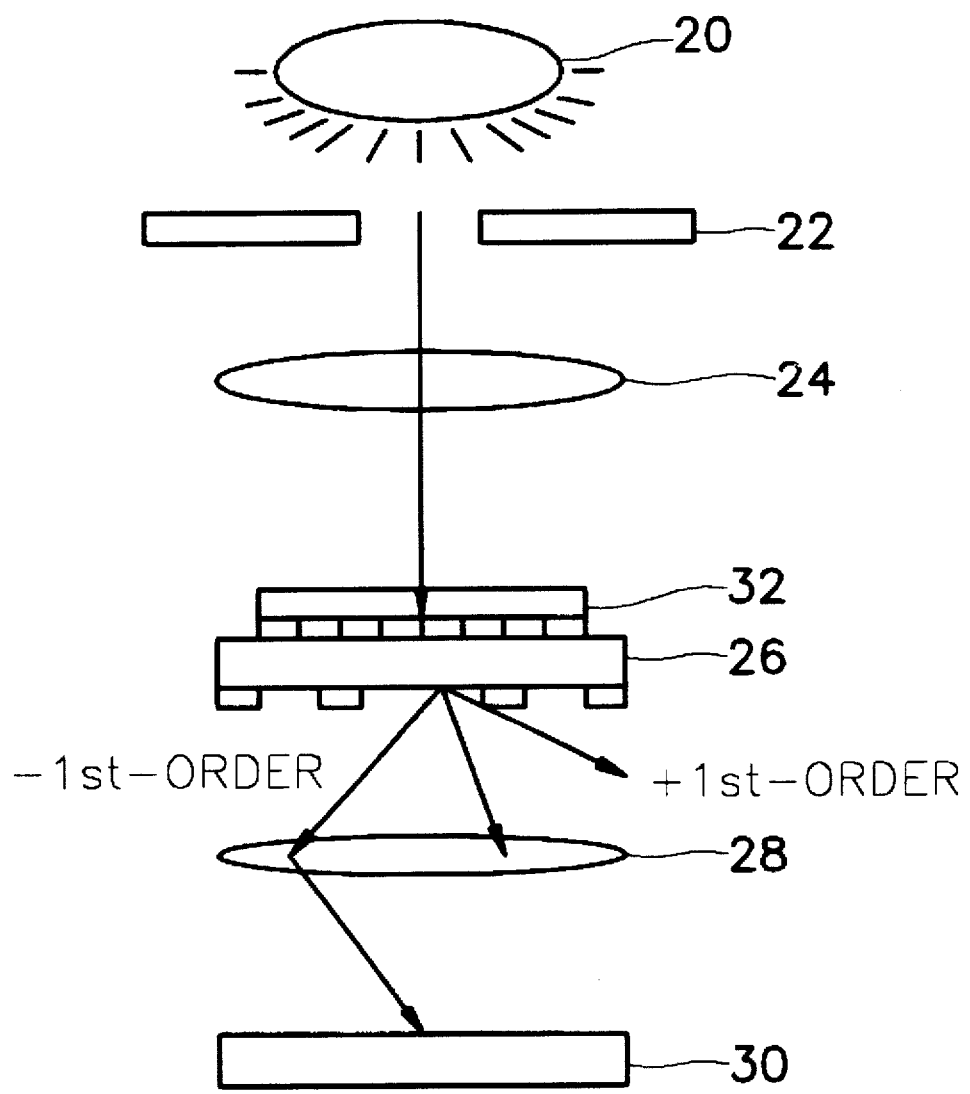
FIG. 4 is a schematic view showing an ATOM system according to the prior art.
Figure 5A:
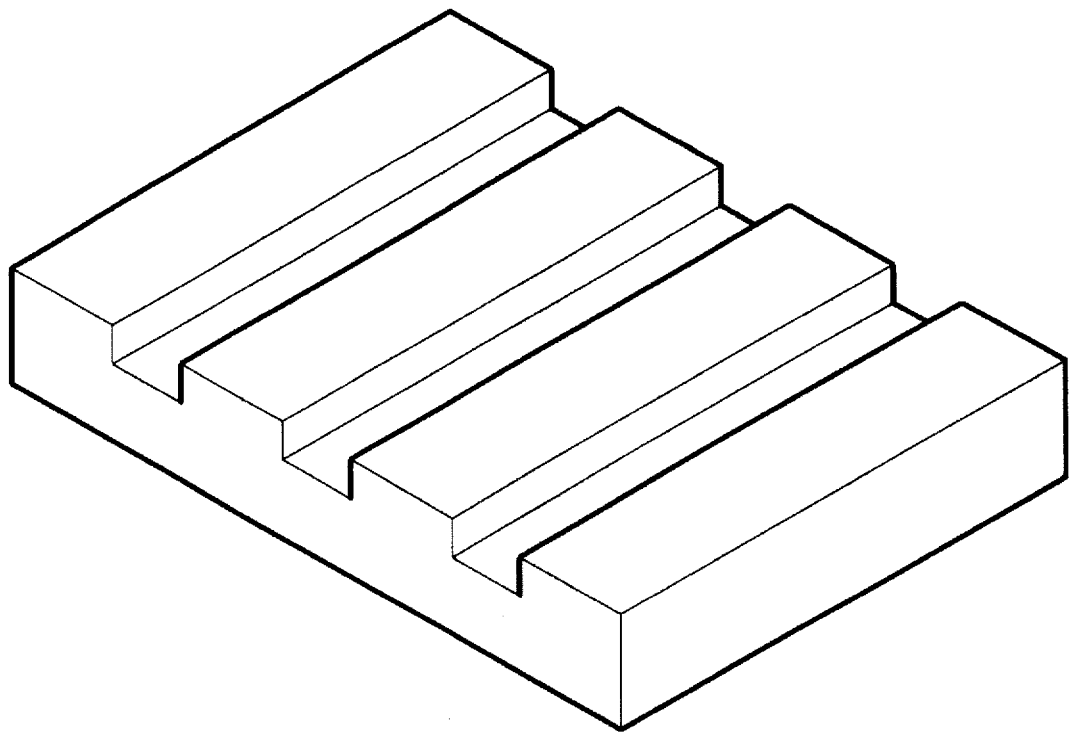
FIG. 5A is a perspective view of a dipole grating mask according to the prior art.
Figure 5B:
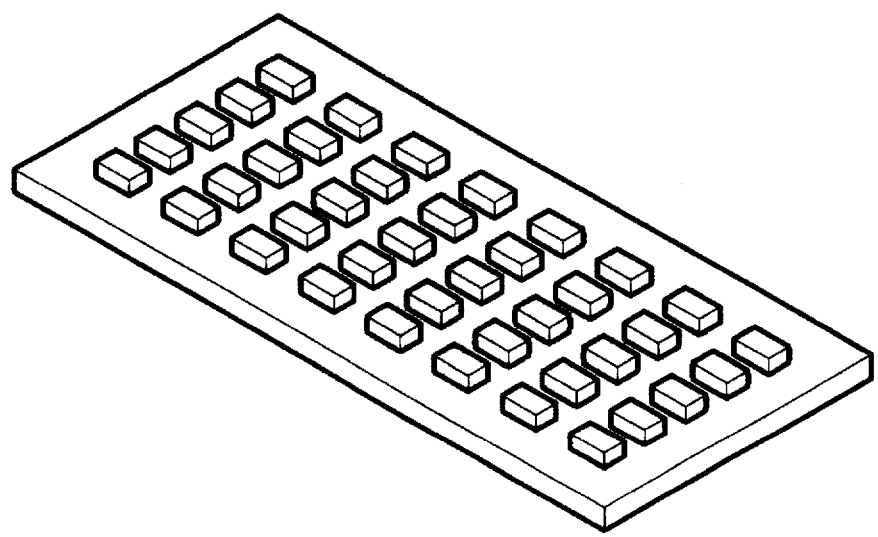
FIG. 5B is a perspective view of a quardrupole grating mask according to the prior art.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

FIGS. 6–9 each illustrate a photolithographic projection system wherein light 60 from the light source passes through a fly's eye lens 62, an aperture 64, an intermediate lens 66, a blind 68, a condenser lens 70, a photomask 72, an objective lens 74, a wafer 76, and a grating mask 80. The grating mask diffracts a vertically incident component of the light as discussed in detail further below.

Figure 6:
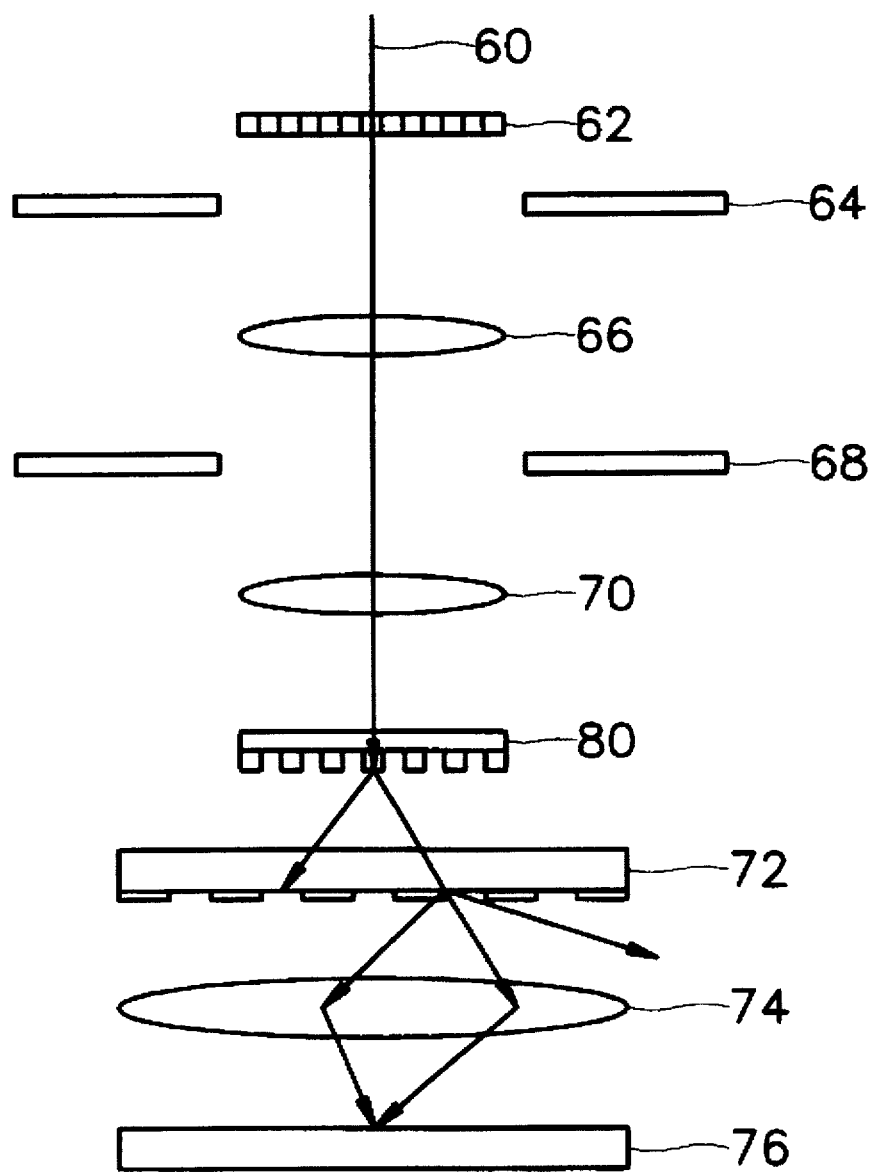
FIGS. 6–8 are schematic views illustrating a photolithographic projection system according to the present invention.

In the system of FIG. 6, the grating mask 80 is separate from the photomask 72 and spaced therefrom. The light 60 from the light source is sequentially transmitted through the fly's eye lens 62, the aperture 64, the intermediate lens 66, the blind 68, and the condenser lens 70. The vertically incident component of the transmitted light is diffracted when transmitted through the grating mask 80. The diffracted light transmitted from the photomask 72 is focused by the objective lens 74 and illuminated on the wafer 76. In particular, the light from the light source is diffracted by the grating mask 80 which is located on a side of the photomask 72 opposite the wafer 76. Accordingly, a vertically incident component of the light incident on the mask 72 is eliminated, and only the component of the light having an oblique incident angle is transmitted to the photomask 72. Accordingly, the benefits of the off-axis illumination method can be obtained without requiring a cover over the central portion of the aperture.

Figure 7:
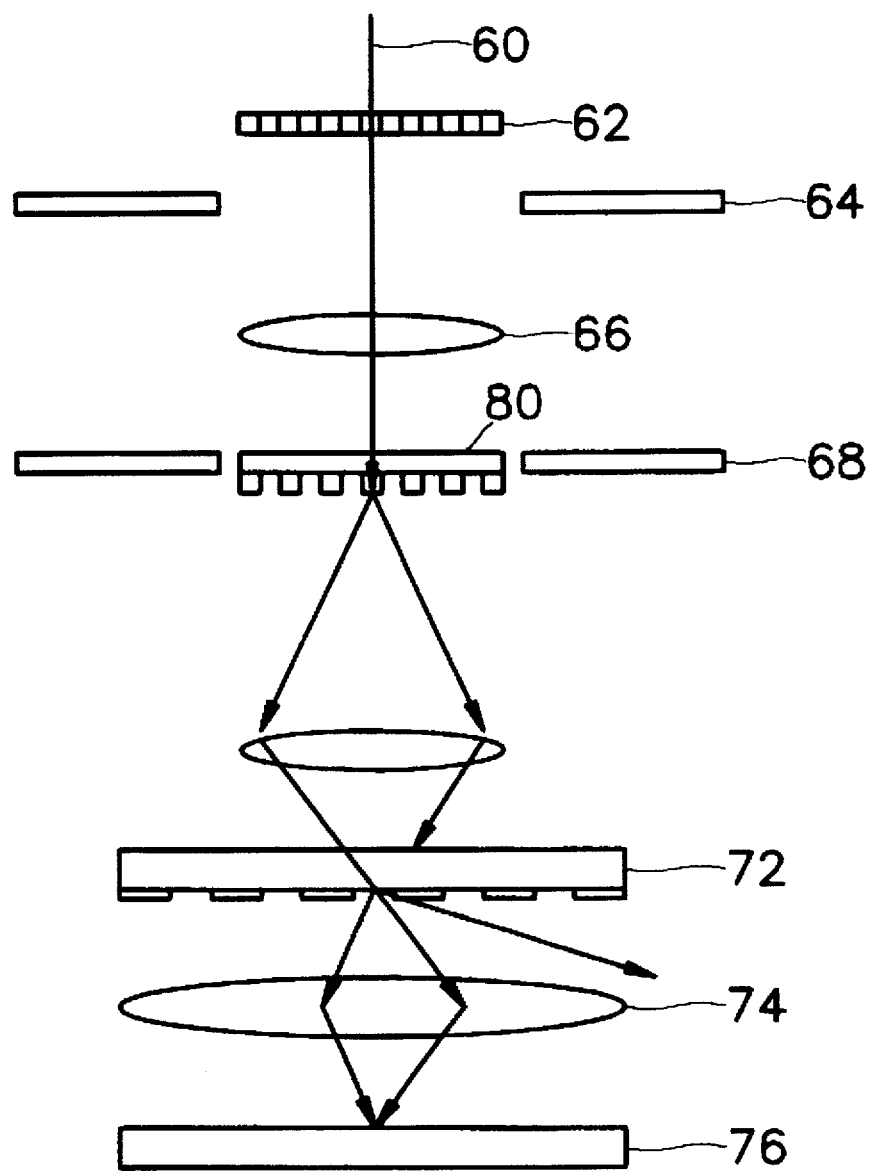

In FIG. 7, the grating mask 80 is mounted between the blinds 68. Light 60 from the light source is sequentially transmitted through the fly's eye lens 62, the aperture 64, the intermediate lens 66, the grating mask 80, the condenser lens 70, and the photomask 72. This light is then focused by the objective lens 74 and illuminated on the wafer 76. The light transmitted through the intermediate lens 66 is diffracted by the grating mask 80 which is provided between the blind 68. Again, a vertically incident component of the light is eliminated and only the obliquely incident component of the light is transmitted to the condenser lens 70. Again, the benefits of off-axis illumination can be realized without requiring a central portion of the aperture to be blocked.

Figure 8:
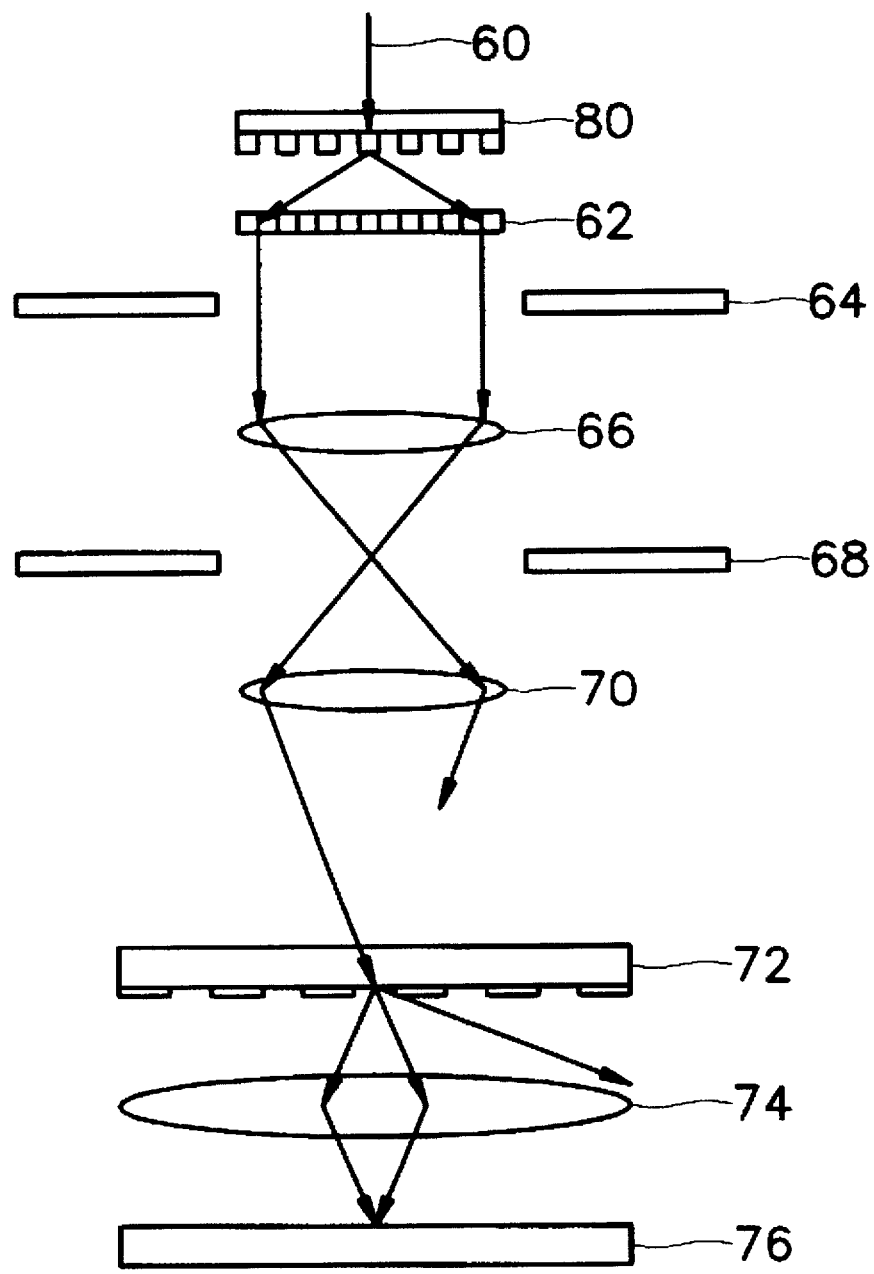

In FIG. 8, the grating mask 80 is mounted onto the fly's eye lens 62. The light 60 from the light source is diffracted by the grating mask 80, thereby eliminating a vertically incident component of the light and thus only illuminating the wafer with an obliquely incident component of the light. Again, the benefits of the off-axis illumination method can be achieved without lowering the efficiency of the light.

As opposed to the partially covered aperture used in the conventional off-axis illumination method, the apertures used in the photolithographic projection systems of FIGS. 6–8 are uncovered. The use of an uncovered aperture reduces loss of the incident light. The grating mask 80 diffracts the incident light thereby reducing a vertically incident component of the light and transmitting only obliquely incident components of the light to the wafer. Either a transmission mask and a phase-shift mask can be used as the photomask 72.

Figure 9:
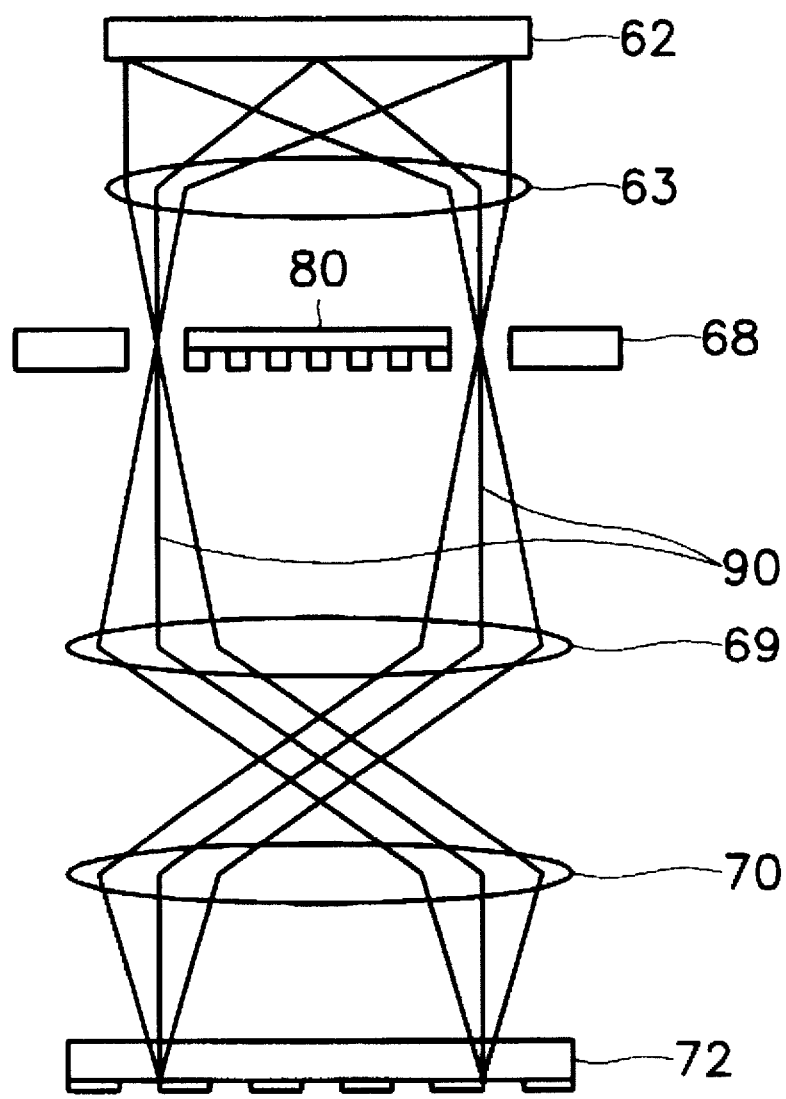
FIG. 9 is a schematic view illustrating a telecentric exposure method for a photolithographic projection system according to the present invention.

FIG. 9 illustrates a telecentric exposure method using a photolithographic projection system of the present invention. In particular, light from the light source is transmitted through the fly's eye lens 62, the first intermediate lens 63, the grating mask 80 located between blinds 68, a second intermediate lens 69, and condenser lens 70 before passing through the photomask 72. According to the telecentric exposure method, a principle ray 90 passing through the center of the blind 68 is vertically incident upon the second intermediate lens 69 and then vertically transmitted from the condenser lens 70. From the condenser lens 70, this principle ray is applied to the exposure apparatus of the present invention.

A photolithographic projection system according to the present invention has the advantage that only one grating mask is required for any number of photomasks used in the system. In addition, the position of the grating mask within the system can be varied. Thus, a separate grating mask is not required for each photomask. In addition, the photomask and the grating mask can be inspected separately as these masks are located separately.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A photolithographic projection system for transferring a predetermined pattern from a photomask to a wafer, said photolithographic system comprising:

a radiation source which projects radiation along a path through the photomask toward the wafer;

a grating mask positioned along the radiation path, said grating mask being separate from the photomask; and blinds adjacent the radiation path wherein said grating mask is located between said blinds.

2. A photolithographic projection system according to claim 1 wherein said grating mask is spaced apart from the photomask.

3. A photolithographic projection system according to claim 1 wherein said grating mask is positioned between said radiation source and the photomask.

4. A photolithographic projection system for transferring a predetermined pattern from a photomask to a wafer, said photolithographic system comprising:

a radiation source which projects radiation along a path through the photomask toward the wafer;

a grating mask positioned along the radiation path, said grating mask being separate from the photomask; and a fly's eye lens positioned along the radiation path between said grating mask and the photomask.

5. A photolithographic projection system according to claim 4 wherein said grating mask is chosen from the group consisting of a dipole grating mask and a quardrupole grating mask.

6. A photolithographic projection system according to claim 4 further comprising an aperture through which the radiation path passes.

7. A method for transferring a predetermined pattern from a photomask to a wafer, said method comprising the step of:

projecting radiation along a path through a grating mask and the photomask toward the wafer, wherein said grating mask is separate from the photomask wherein said projected radiation passes through blinds and wherein said grating mask is located between said blinds.

8. A method according to claim 7 wherein said grating mask is spaced apart from the photomask.

9. A method according to claim 7 wherein said grating mask is positioned on a side of the photomask opposite the wafer.

10. A method for transferring a predetermined pattern from a photomask to a wafer, said method comprising the steps of:

projecting radiation along a path through a grating mask and the photomask toward the wafer, wherein said grating mask is separate from the photomask; and passing said projected radiation through a fly's eye lens positioned along the radiation path between said grating mask and the photomask.

11. A method according to claim 10 wherein said grating mask is chosen from the group consisting of a dipole grating mask and a quadrupole grating mask.

12. A method according to claim 10 wherein the photomask is chosen from the group consisting of a transmission mask and a phase-shifting mask.

* * * * *